(12) United States Patent
Xu et al.

(10) Patent No.: US 11,984,461 B2
(45) Date of Patent: May 14, 2024

(54) IMAGE SENSOR AND DEPTH IMAGING SYSTEM

(71) Applicant: Rockchip Electronics Co., Ltd., Fuzhou (CN)

(72) Inventors: Huabing Xu, Fuzhou (CN); Qiang Ni, Fuzhou (CN); Gang Wang, Fuzhou (CN); Chuyi Chen, Fuzhou (CN); Fayao Zheng, Fuzhou (CN); Da Xu, Fuzhou (CN); Mingpei Liu, Fuzhou (CN)

(73) Assignee: Rockchip Electronics Co., Ltd., Fuzhou (CN)

( * ) Notice: Subject to any disclaimer, the term of this patent is extended or adjusted under 35 U.S.C. 154(b) by 387 days.

(21) Appl. No.: 17/530,437

(22) Filed: Nov. 18, 2021

(65) Prior Publication Data
US 2022/0190269 A1    Jun. 16, 2022

(30) Foreign Application Priority Data
Nov. 19, 2020   (CN) .......................... 202011302419.4

(51) Int. Cl.
*H01L 27/146*   (2006.01)
*G06T 7/521*    (2017.01)
*H10K 30/35*    (2023.01)
*H10K 39/32*    (2023.01)

(52) U.S. Cl.
CPC ........ *H01L 27/14601* (2013.01); *G06T 7/521* (2017.01); *H01L 27/14625* (2013.01); *H01L 27/14627* (2013.01); *H10K 30/35* (2023.02); *H10K 39/32* (2023.02); *G06T 2207/10028* (2013.01)

(58) Field of Classification Search
CPC ......... H01L 27/14601; H01L 27/14625; H01L 27/14627; H01L 27/14609; H01L 27/1469; H01L 27/1462; G06T 7/521; G06T 2207/10028; H10K 30/35; H10K 39/32
See application file for complete search history.

(56) References Cited

U.S. PATENT DOCUMENTS

2018/0122852 A1*   5/2018   Nishimura ........ H01L 27/14818
2021/0043689 A1*   2/2021   Tokuhara ............ H01L 31/0232

* cited by examiner

*Primary Examiner* — Douglas W Owens
(74) *Attorney, Agent, or Firm* — IPRTOP LLC

(57) ABSTRACT

The present disclosure provides an image sensor, which may include a driving layer, a negative electrode layer formed in the driving layer, a N-region layer formed above the negative electrode layer. The N-region layer includes multiple cylindrical structures formed of semiconductor materials. The image sensor may also include a light absorption layer formed above the N-region layer. The light absorption layer is composed of a multi-layer structure including a P-region layer formed using quantum dot semiconductor materials. The image sensor may further include a positive electrode layer formed above the light absorption layer and configured to receive incoming light signals.

20 Claims, 3 Drawing Sheets

IMAGE SENSOR AND DEPTH IMAGING SYSTEM

CROSS REFERENCE TO RELATED APPLICATION

The present application is a US non-provisional application claiming the benefit of priority to a Chinese Patent Application No. CN 2020113024194 filed with CNIPA on Nov. 19, 2020, the disclosure of the above application is incorporated herein by reference in its entirety for all purposes.

TECHNICAL FIELD

The present disclosure relates to a depth imaging system for capturing an imaging object, and more specifically, to an image sensor in the depth imaging system having a light absorption layer.

BACKGROUND

A depth imaging system, which can detect the three-dimensional (3D) spatial information of a physical object, may also be known as a 3D imaging system. The depth imaging system usually include: a light emission module, a three-dimensional photosensitive module, an optical lens, and an image processing chip. According to various technology principles, mainstream depth imaging systems may generally be divided based on the following technologies: time-of-flight technology, structured light technology, and binocular stereo vision technology.

The principle of the time-of-flight (TOF) technology to detect distance is to continuously transmit modulated light pulses with a specific frequency (usually invisible light) to the object to be observed, and detect the light pulses reflected from the object. The flight (round-trip) time of the pulses may be used to calculate the distance of the measured object from the imaging system.

For a structured light technology imaging system, the light projector of the system may use specific patterns (such as discrete light spots, striped light, coded structured light, etc.) to illuminate the measured object, and the imaging system then evaluates the distortion on the surface of the measured 3D object imaging. If the surface of the measured object is uneven, the structured light pattern observed by the 3D photosensitive module may produce different distortions, and the degree of distortion may be related to the distance. According to the known structured light pattern and the observed deformation, the structured light imaging system can calculate the three-dimensional shape and depth information of the measured object.

The principle of the binocular stereo vision technology is similar to that of the human eye. By calculating the parallax of the same measured object in the space imaged by two cameras, the distance between the object and the cameras can be calculated according to the triangular relationship.

Depth imaging system products may be widely used in 3D modeling, natural human-computer interaction (gesture/face recognition), AR/VR, autonomous driving and other fields. Depth imaging system products are expected to lead a new generation of human-computer interaction. However, the miniaturization of the depth imaging system (TOF) is very difficult for smartphones, and the detectable distance of TOF may also be very limited.

SUMMARY OF THE DISCLOSURE

The present disclosure provides an image sensor, which may include a driving layer, a negative electrode layer formed in the driving layer, a N-region layer formed above the negative electrode layer. The N-region layer includes multiple cylindrical structures formed of semiconductor materials. The image sensor may also include a light absorption layer formed above the N-region layer. The light absorption layer is composed of a multi-layer structure including a P-region layer formed using quantum dot semiconductor materials. The image sensor may further include a positive electrode layer formed above the light absorption layer and configured to receive incoming light signals.

COMPONENT LABEL DESCRIPTION

Figure 1:
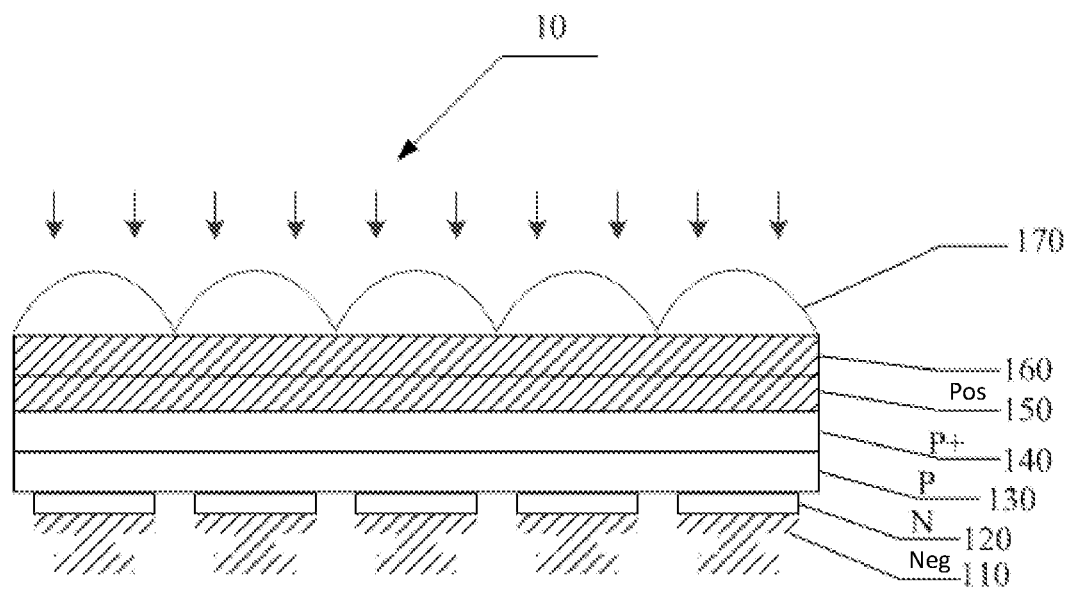
FIG. 1 illustrates a schematic structural diagram of an image sensor, according to one or more embodiments of the present disclosure.

1 Depth imaging system
10 Image sensor
20 Light Emitters
30 Optical lenses
301 First optical lens
302 Second optical lens
40 Image processor
110 Negative electrode layer
120 N-region layer
130 First P-region layer
140 Second P-region layer
150 Positive electrode layer
160 Filter layer
170 Micro-lens layer
180 Third P-region layer
190 Fourth P-region layer
1100 I-region layer
1110 I-region layer
2 Physical object

DETAILED DESCRIPTION

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figures, can be arranged, substituted, combined, and designed in a wide variety of different configurations, all of which are explicitly contemplated herein.

The purpose of this embodiment is to provide an image sensor for a depth imaging system, which can be used to increase the detection distance and improve the accuracy of a TOF depth imaging system. Specifically, this image sensor may be constructed based on quantum dot semiconductor material, which can significantly increase the detection distance and improve the accuracy of the TOF depth imaging system.

Figure 6:
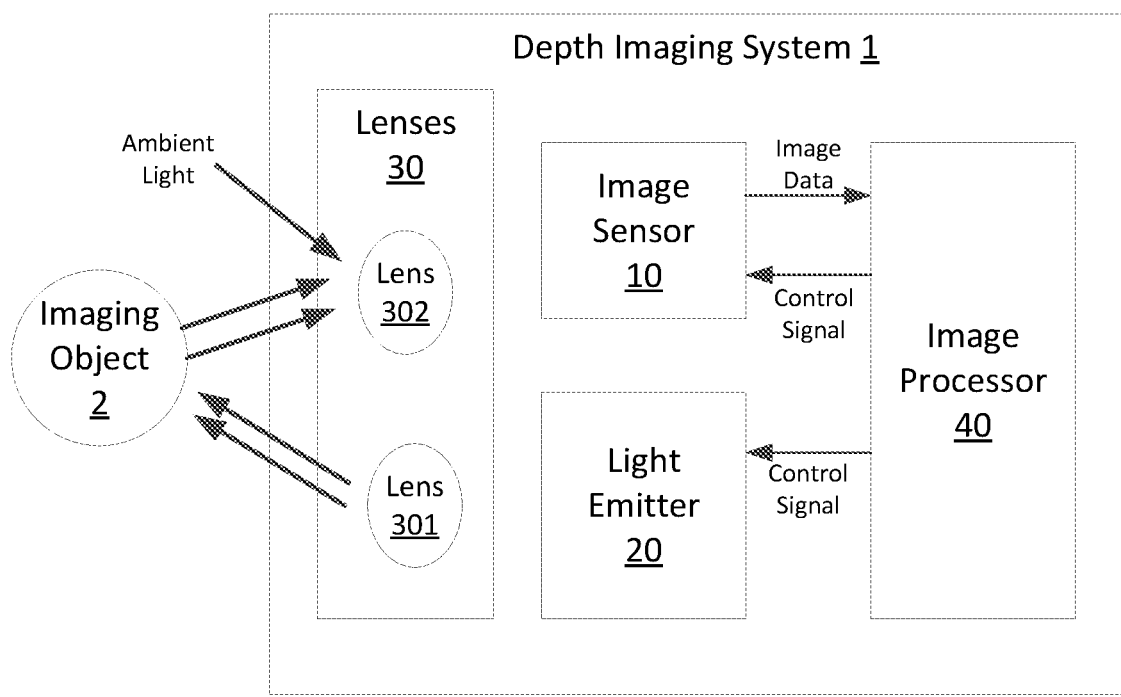
FIG. 6 shows a depth imaging system, according to one or more embodiments of the present disclosure.

FIG. 6 illustrates a depth imaging system configured with an image sensor to provide TOF depth determination, according to one or more embodiments of the present disclosure. In FIG. 6, the depth image system 1 may include, among other components and modules, an image sensor 10, a light emitter 20, one or more optical lenses 30 (e.g., lens 301 and lens 302), and an image processor 40. The light emitter 20 may be configured to emit/transmit a light beam that may be visible or invisible to human eyes. Light beam from the light emitter 20 may pass through the lens 301 toward a physical object 2 (or imaging object), which may be located a certain distance away from the image system 1. Lights reflected from the object 2 and the surrounding environment may enter the lens 302 and then pass through the lens 302 toward the image sensor 10. The image sensor 10 may generate optical or digital signals based on the reflected lights, and analyze the signals to generate depth image data. The image sensor 10 may then transmit the depth image data to the image processor 40 for further processing. Alternatively, the image sensor 10 may transmit the signals to the image process 40, which may generate the depth image data based on the signals.

In some embodiments, the image sensor 10 (or "light receiver") and the light emitter 20 (or "light transmitter") may be integrated into a single chip module or package. Further, the image sensor 10, the light emitter 20, and the optical lens 30 may be integrated into a single chip module/package. A single package may allow an easy adaptation or integration with the image processor 40 for the depth image system 1. In some embodiments, the depth image system 1 may be a component of electronic devices such as smart phones, mobile phones, tablets, personal data assistants (PDAs), or any devices (e.g., image or video cameras) having image or video capturing capabilities.

In some embodiments, the light emitter 20 may use LED and/or VESEL as its light source to generate the human visible or invisible light beams. The first optical lens 301 includes, but is not limited to, a collimating optical element and/or a diffractive optical element (Daman Grating or DOE), and may also be a diffusing optical element (Diffuser). The lenses 30 may include one or more optical lens groups and optical one or more bandpass filters.

In some embodiments, the light emitter 20 may emit a light beam with a specific spectrum and embedded with a specific image pattern. Once the light beam with the specific image pattern is irradiated onto the object 2, the reflected lights captured by the lens 302 may also contain the full or a part of the image pattern. Further, ambient lights and stray lights from other sources may also enter or be reflected into the lens 302. In this case, the filters in the lenses 30 may filter out these ambient lights and stray lights, allowing the light beams with specific spectrum to reach the image sensor 10. The image sensor 10 may then convert the received light beams into light signals, and generate depth image data based on the light signals.

In some embodiments, the image processor 40 may be a graphic processing unit (GPU), a digital signal processor (DSP), or a central processing unit (CPU). Further, the depth image system 1 may include physical hardware components such as, without limitation, memory, network communication module, and/or additional electronic circuit components (all of them are not shown in FIG. 6). The depth image system 1 may also include physical storage medium for data storage and data access. For example, the depth image system 1 may have rotational hard drives, SSD-based device using flash-based memory, or RAM-based storage medium. The physical storage medium may provide various data storage services.

Referring back to FIG. 1. FIG. 1 illustrates an image sensor to provide TOF depth determination, according to one or more embodiments of the present disclosure. Specifically, FIG. 1 shows a vertical cross-sectional view of a semiconductor structure within an image sensor 10. The semiconductor structure may be formed by multiple layers of semiconductor materials, including, without limitations, a negative electrode layer 110, a N-region layer 120, a light absorption layer, and a positive electrode layer 150.

In some embodiments, the negative electrode layer 110 may be formed in or above a driving layer (not shown in FIG. 1). The driving layer may include electric circuits and wires that may be formed by CMOS, TFT, etc., and may be connected to the negative electrode layer 110. The negative electrode layer 110 may include several negative electrodes, which are made of metal materials such as aluminum, Ag, and Au. Further, the negative electrode layer 110 may be constructed based on, without limitation, an evaporation process. In the evaporation process, the structures of the negative electrodes in the negative electrode layer 110 may be, for example, but not limited to, I-shaped. And the spaces between the negative electrodes may be filled with insulating material.

In some embodiments, the N-region layer 120 may be formed above the surface of the negative electrode layer 110, and may include a set of cylindrical structures, which are constructed based on semiconductor materials that correspond to the set of negative electrodes in the negative electrode layer 100. Further, a light absorption layer may be formed on or above the surface of the N-region layer 120. The light absorption layer may be composed of a multi-layer structure, including at least a P-region layer (e.g., layer 130) formed using quantum dot semiconductor materials.

In some embodiments, quantum dot may be a low-dimensional semiconductor material, with at least one of its three dimensions not being larger than twice of the exciton Bohr radius of such low-dimensional semiconductor material. Quantum dots may generally be spherical or quasi-spherical shaped, and their diameters may usually be between 2 and 20 nm. Typical quantum dots may be composed of IV, II-VI, IV-VI or III-V elements.

In some embodiments, quantum dots may be nanoscale semiconductors. When a certain electric field or light pressure is applied, these nano-semiconductors may emit a specific frequency light, and the frequency of the emitted light may change when the size of the nano-semiconductors changes. By adjusting the nano-semiconductors' size, the color of the light the quantum dots emit may also change. Because the nano-semiconductors have the property of confining electrons and holes in similar fashions as atoms or molecules do in nature, they may be referred to as quantum dots.

In some embodiments, the quantum dots may be composed of by bulk materials, or by two or more types of semiconductor materials. Specifically, the quantum dots may be composed of by bulk materials (such as silicon quantum dots), or may be composed of two or more types of semiconductor materials, such as IIB, VIA group elements (CdS, CdSe, CdTe, ZnSe, etc.), IIIA, VA group elements (InP, InAs, etc.) or IV, VI group compounds (PbS, PbSe, etc.).

In some embodiments, the quantum dot semiconductor material may have an external quantum efficiency of more than 80% in near-infrared (800~1500 nm) range, and may have a very high signal-to-noise ratio for absorbing/sensing lights in the near-infrared spectrum. These characteristics may allow accurate measurement by the image sensor in distances ranging from 0.1 meter to 100 meters.

In some embodiments, the light absorption layer (at least including the P-region layer formed by quantum dot semiconductor material) may specifically adopt any one of the following structures.

(1) First embodiment of the light absorption layer structure: As shown in FIG. 1, the P-region layer may include: a first P-region layer 130 (indicated in FIG. 1 by "P") and a second P-region layer 140 (indicated in FIG. 1 by "P+"). That is, the structure of the light absorption layer may be composed of two P-region layers: the first P-region layer 130 and the second P-region layer 140.

In some embodiments, the first P-region layer 130 (indicated by "P" in FIG. 1) may be correspondingly formed on or above the surface of the N-region layer 120. The second P-region layer 140 (indicated by "P+" in FIG. 1) may be correspondingly formed on or above the surface of the first P-region layer 130, and may have a higher doping concentration than the doping concentration of the first P-region layer 130.

In some embodiments, the first P-region layer 130 may be a low-doped light absorption layer, the second P-region layer 140 may be a high-doped light absorption layer, and the first P-region layer 130 and the second P-region layer 140 may have a ratio of 5~1000 times in doping difference.

In some embodiments, at least one of the first P-region layer 130 and the second P-region layer 140 may be formed by the quantum dot semiconductor material. Specifically, the first P-region layer 130 may be formed by the quantum dot semiconductor material, and the second P-region layer 140 may be formed by an organic semiconductor material or an inorganic compound. Alternatively, the first P-region layer 130 may be formed by an organic semiconductor material or an inorganic compound, and the second P-region layer 140 may be formed by quantum dot semiconductor material. Further, both the first P-region layer 130 and the second P-region layer 140 may be formed by quantum dot semiconductor material.

In some embodiments, the manufacturing method of the first P-region layer 130 may include, but not limited to, smearing, wiping, spray printing, epitaxy, or deposition, and the like. The manufacturing method of the second P-region layer 140 may include, but not limited to, liquid-phase coating, blade coating, printing epitaxy, or deposition, and the like.

Figure 2:
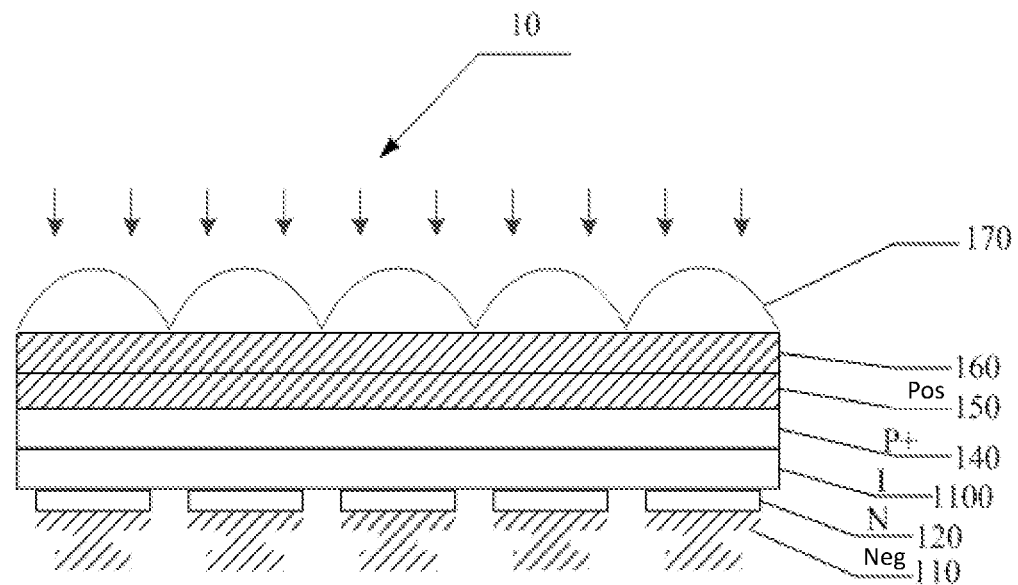
FIG. 2 illustrates another schematic structural diagram of the image sensor, according to one or more embodiments of the present disclosure.

(2) Second embodiment of the light absorption layer structure: As shown in FIG. 2, the light absorption layer may include: an I-region layer 1100 correspondingly formed on or above the surface of the N-region layer 120. In this embodiment, a P-region layer may correspondingly be formed on the surface of the I-region layer 1100. That is, in this embodiment, the light absorption layer may include a two-layer structure: a P-region layer (indicated by "P+" in FIG. 2) and an I-region layer 1100 (indicated by "I" in FIG. 2).

In this case, the above P-region layer may be a single layer, which may be referred to as the second P-region layer 140. The P-region layer may be formed using quantum dot semiconductor material, and the manufacturing method of the P-region layer may include, but not limited to, liquid-phase smearing, scraping, and printing. Epitaxy or deposition, etc. Further, the I-region layer 1100 may be formed using quantum dot semiconductor material, and the manufacturing method may include, but not limited to, smearing, wiping, spray-printing epitaxy or deposition, and the like.

Figure 3:
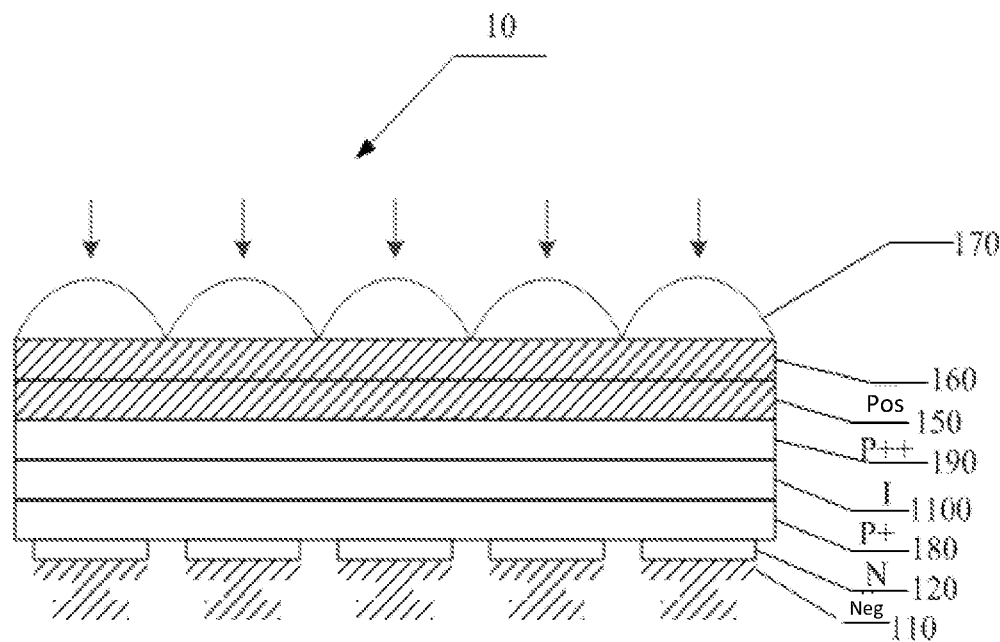
FIG. 3 illustrates a further schematic structural diagram of the image sensor, according to one or more embodiments of the present disclosure.

(3) Third embodiment of the light absorption layer structure: As shown in FIG. 3, the light absorption layer may include: a third P-region layer 180 (indicated by "P+" in FIG. 3), an I-region layer 1110 (indicated by "I" in FIG. 3) and a fourth P-region layer 190 (indicated by "P++" in FIG. 3).

In this embodiment, as shown in FIG. 3, the third P-region layer 180 may be correspondingly formed on or above the surface of the N-region layer 120; the I-region layer 1110 may be correspondingly formed on or above the surface of the third P-region layer 180. The doping concentration of the fourth P-region layer 190 may be higher than that of the third P-region layer 180, and the fourth P-region layer 190 may be correspondingly formed on or above the surface of the I-region layer 1110.

In some embodiments, the third P-region layer 180 may be a low-doped light absorption layer, the fourth P-region layer 190 may be a high-doped light absorption layer, and the third P-region layer 180 and the fourth P-region layer 190 may have a ratio of 5~1000 times in doping difference.

In some embodiments, at least one of the third P-region layer 180 and the fourth P-region layer 190 may be formed using quantum dot semiconductor material. Specifically, for example, the third P-region layer 180 may be formed using a quantum dot semiconductor material, and the fourth P-region layer 190 may be formed using an organic semiconductor material or an inorganic compound. Alternatively, the third P-region layer 180 may be formed using an organic semiconductor material or an inorganic compound, and the fourth P-region layer 190 may be formed using a quantum dot semiconductor material. Further, both the third P-region layer 180 and the fourth P-region layer 190 may be formed using a quantum dot semiconductor material.

In some embodiments, the manufacturing method of the third P-region layer 180 may include, but not limited to, smearing, wiping, spray printing, epitaxy, or deposition, and the like. The manufacturing method of the fourth P-region layer 190 may include, but not limited to, liquid phase coating, blade coating, printing epitaxy, or deposition, and the like.

Referring back to FIG. 1. In some embodiments, the first P-region layer 130 (indicated by "P" in FIG. 1) and the second P-region layer 140 (indicated by "P+" in FIG. 1) may serve as the light absorption layer in FIG. 1. To absorb various wavelengths of light, the gap of light bands for the light absorption layer may need to be less than 1.3 eV in general. Material with band gap that is too narrow may easily lead to the generating of tunneling current under strong electric field, which may affect the normal operation of the device. In order to reduce the dark current caused by tunneling, FIG. 3 adopts a structure which separates the light absorption layer and the charge-multiplying region. Specifically, the light absorption layer may be placed between the P++/P+ layers, and the P+ layer may serve as the chargemultiplication N-region by using a material with a bandwidth that is wider than the forbidden band width. This structure greatly relieves the electric field strength of the light absorption layer, thereby effectively reducing the dark count rate (DCR) associated with the dark current shock.

In some embodiments, the N-region layer 120 (indicated by "N" shown in FIG. 1 to FIG. 3) may be correspondingly formed on or above the surface of the negative electrode layer 110, and may include multiple cylindrical structures formed using semiconductor materials.

In some embodiments, the N-region layer 120 may be constructed using quantum dot semiconductor materials, semiconductor nanoparticles, and/or inorganic or organic semiconductor bulk materials.

Figure 4:
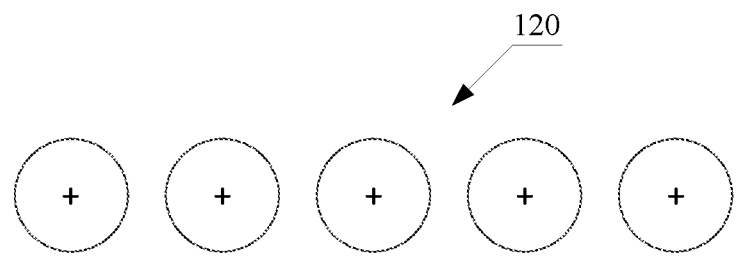
FIG. 4 shows a top view of the N-region layer in the image sensor, according to one or more embodiments of the present disclosure.

FIG. 4 shows a top view of the N-region layer 120, in which an insulating medium may fill the surrounding of the cylindrical structures (e.g., metal electrodes). Specifically, the insulating medium may be an inorganic medium or an organic insulating medium. For example, the insulating medium may be an inorganic medium such as silicon dioxide and silicon nitride.

Figure 5:
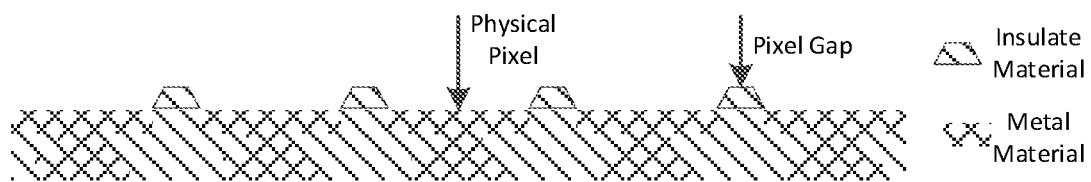
FIG. 5 shows a schematic cross-sectional view of the N-region layer in the image sensor, according to one or more embodiments of the present disclosure.

In some embodiment, the metal electrodes (in the negative electrode layer 110) may be prepared once the last step of manufacturing the driving layer (CMOS/TFT) is completed. As shown in FIG. 5, all sides of the negative electrodes may be surrounded by the insulating layer. Further, the parts of insulating layer above the negative electrodes may be etched into a circular pit, and the fabrication of a single-photon avalanche diode (SPAD) device may start from the basis of this surface.

In some embodiments, for example, a manufacturing process may fabricate, from bottom to top, a N-region layer 120 (N+), a first P-region layer (P), a second P-region layer 140 (P+), and a positive electrode layer 150. The end result may be shown in FIG. 1, in which a single-photon avalanche diode (SPAD) device with a P+/P/N+ structure may be formed above the driving layer (CMOS/TFT).

In some embodiments, another manufacturing process may fabricate, from bottom to top, a N-region layer 120 (N+), an I-region layer 1100 (I), a P-region layer (P+), and a positive electrode layer 150. The end result may be shown in FIG. 2, in which a SPAD device with a P+/I/N+ structure may be formed above the driving layer (CMOS/TFT).

In some embodiments, a further manufacturing process may fabricate, from bottom to top, a N-region layer 120 (N+), a third P-region layer 180 (P+), an I-region layer 1110 (I), a fourth P-region layer 190 (P++), and a positive electrode layer 150. The end result may be shown in FIG. 3, in which a SPAD device with a P++/I/P+/N+ structure may be formed above the driving layer (CMOS/TFT). And the SPAD device may be directly connected with the CMOS/TFT circuit through the negative electrode below.

In some embodiments, the positive electrode layer 150 may be correspondingly formed on or above the surface of the light absorption layer to receive incident light beams.

Under normal operation, the positive electrodes of all pixels may be connected together via the positive electrodes of a SPAD device, and the negative electrode of the image sensor may be controlled by the CMOS/TFT circuit. For a SPAD device or application which works under a reverse bias, a high voltage may be applied to the negative electrode of the SPAD device to subject the P/N+ junction of the SPAD device to a very high electric field. Under a weak light or even single-photon light irradiation, the light absorption layer of the SPAD device may absorb light to generate electron-hole pairs. Under the influence of the electric field, the electrons may then move to the negative electrode and accelerate under the strong electric field at the P/N+ interface. When collision ionization occurs, more electron-hole pairs may be generated, and finally a current multiplication of the order of ~1e5 or more is formed. The CMOS/TFT control circuit connected to the negative electrode may control the electric field strength, and may recover the avalanche multiplication through the design of the suppression circuit after a large current occurs. The CMOS/TFT control circuit may also read high current pulses to achieve timing counting.

Referring back to FIG. 1. In some embodiment, the image sensor 10 may further include: a filter layer 160 formed on or above the surface of the positive electrode layer 150 for filtering out light beams having wavelengths within a preset range. The image sensor 10 may further include a micro-lens layer 170 formed on or above the surface of the filter layer 160. The micro-lens layer 170 may contain micro-lenses each of which corresponds to the position of a specific cylindrical structure in the N-region layer 120.

Since the image pixel size of an image sensor may be determined by the circular area of the cylindrical structures in the N-layer region, the spacings among these cylindrical structures may become blind areas for the image sensor 10. The performance of the image sensor in terms of spacings and blind areas may be described by the parameter pixel fill rate (FF).

in some embodiments, in order to improve FF, a micro-lens layer 170 (micro lens) may be formed above the positive electrode layer 150 of the image sensor 10, and the FF is compensated by using the micro lens in the micro-lens layer 170, which may compensate the image sensor 10's FF up to 100%.

In addition, since the target to be detected by the image sensor 10 is usually at a fixed wavelength, a filter layer 160 may be added between the micro-lens layer 170 and the surface of the positive electrode layer 150, in order to filter out light signals of those wavelengths that are not of interest.

In some embodiments, the incident light may reach the positive electrode of the image sensor 10 through the micro-lens layer 170 and then through the filter layer 160. The micro-lens layer 170 and the filter layer 160 may optionally be applicable to the above P+/P(I)/N structure or the P++/I/P+/N structure. The filter layer 160 may be configured to filter lights with specific wavelength. Using the light absorption layer including quantum dot semiconductor material, the image sensor may have relatively low cost, achieve the detection of light signal having near-infrared wavelength of 800-1500 nm, and have high single-photon detection rate.

In conclusion, the light absorption layer of the image sensor may contain quantum dot semiconductor materials, which can significantly improve the detection distance and accuracy of the depth imaging system. The present disclosure may further integrate the light emitter and the image sensor in one independent package. The package module improves the integration of the depth imaging system. Therefore, the present disclosure effectively overcomes various shortcomings and has high industrial application value.

The above-mentioned embodiments merely illustrate the principles and effects of the present disclosure, but are not intended to limit the present disclosure. Anyone skilled in the art can make modifications or changes to the above embodiments without departing from the spirit and scope of the present disclosure. Therefore, all equivalent modifications or changes made by those skilled in the art without departing from the spirit and technical idea disclosed in the present disclosure should still be covered by the claims of the present invention.

One or more embodiments of the disclosure may relate to a device or an apparatus for performing these operations. The apparatus may be specially constructed for specific required purposes, or it may be a specific-purpose computer selectively activated or configured by a computer program stored in the computer. In particular, various specific-purpose machines may be used with computer programs written in accordance with the teachings herein, or it may be more convenient to construct a more specialized apparatus to perform the required operations. The various embodiments described herein may be practiced with other computer system configurations including hand-held devices, microprocessor systems, microprocessor-based or programmable consumer electronics, minicomputers, mainframe computers, and the like.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the disclosure(s). In general, structures and functionality presented as separate components in exemplary configurations may be implemented as a combined structure or component. Similarly, structures and functionality presented as a single component may be implemented as separate components. These and other variations, modifications, additions, and improvements may fall within the scope of the appended claims(s).

What is claimed is:

1. An image sensor, comprises:
   a driving layer;
   a negative electrode layer formed in the driving layer;
   a N-region layer formed above the negative electrode layer, wherein the N-region layer includes multiple cylindrical structures formed of semiconductor materials;
   a light absorption layer formed above the N-region layer, wherein the light absorption layer is composed of a multi-layer structure including a P-region layer formed using quantum dot semiconductor materials; and
   a positive electrode layer formed above the light absorption layer and configured to receive incoming light signals.

2. The image sensor according to claim 1, wherein the P-region layer comprises:
   a first P-region layer formed above the N-region layer; and
   a second P-region layer formed above the first P-region layer, wherein the second P-region layer has a doping concentration that is higher than that of the first P-region layer.

3. The image sensor according to claim 2, wherein
   the first P-region layer is formed of quantum dot semiconductor material, and the second P-region layer is formed of organic semiconductor material or inorganic compound;
   the first P-region layer is formed of organic semiconductor material or inorganic compound, and the second P-region layer is formed of quantum dot semiconductor material; or
   both the first P-region layer and the second P-region layer are formed of quantum dot semiconductor material.

4. The image sensor according to claim 1, wherein the light absorption layer comprises:
   an I-region layer formed above the N-region layer, wherein the P-region layer is formed above the I-region layer.

5. The image sensor according to claim 1, wherein the light absorption layer comprises:
   a first P-region layer formed above the N-region layer;
   an I-region layer formed above the first P-region layer; and
   a second P-region layer formed above the I-region layer, wherein the second P-region has a doping concentration that is higher than that of the first P-region layer.

6. The image sensor according to claim 5, wherein:
   the first P-region layer is formed of quantum dot semiconductor material, and the second P-region layer is formed of organic semiconductor material or inorganic compound;
   the first P-region layer is formed of organic semiconductor material or inorganic compound, and the second P-region layer is formed of quantum dot semiconductor material; or
   both the first P-region layer and the second P-region layer are formed of quantum dot semiconductor material.

7. The image sensor according to claim 1, wherein the image sensor further comprises:
   a filter layer formed above the positive electrode layer, wherein the filter layer is configured to filter out light signals with preset range of wavelengths; and
   a micro-lens layer formed above the filter layer, wherein the micro-lens layer contains micro-lens each of which corresponds to one of the multiple cylindrical structures in the N-region layer.

8. The image sensor according to claim 1, wherein
   the N-region layer is composed of quantum dot semiconductor materials, semiconductor nanoparticles, inorganic, or organic semiconductor bulk materials.

9. The image sensor according to claim 8, wherein the quantum dot semiconductor material is composed of bulk material or two or more semiconductor materials.

10. The image sensor according to claim 1, wherein
    the N-region layer includes an insulating medium formed among the multiple cylindrical structures.

11. The image sensor according to claim 10, wherein the insulating medium is an inorganic medium or an organic insulating medium.

12. A depth imaging system for capturing an imaging object, comprises:
    an image processor;
    an image sensor coupled with the image processor;
    a light transmitter configured to emit a beam of light invisible to human eyes toward the imaging object; and
    an optical lens configured to irradiate the beam of light toward the imaging object or direct light reflected by the imaging object and entered into the optical lens to the image sensor;
    wherein the image sensor is configured to receive the light reflected by the imaging object to generate a light signal, the image processor is configured to process the light signal and generate depth image data associated with the imaging object, and the image sensor comprises:
    a driving layer;
    a negative electrode layer formed in the driving layer;

a N-region layer formed above the negative electrode layer, wherein the N-region layer includes multiple cylindrical structures formed of semiconductor materials;

a light absorption layer formed above the N-region layer, wherein the light absorption layer is composed of a multi-layer structure including a P-region layer formed using quantum dot semiconductor materials; and a positive electrode layer formed above the light absorption layer and configured to receive incoming light signals.

13. The depth imaging system according to claim 12, wherein the light emitter and the image sensor are integrated in one package.

14. The depth imaging system according to claim 12, wherein the P-region layer comprises:

a first P-region layer formed above the N-region layer; and a second P-region layer formed above the first P-region layer, wherein the second P-region layer has a doping concentration that is higher than that of the first P-region layer.

15. The depth imaging system according to claim 14, wherein the first P-region layer is formed of quantum dot semiconductor material, and the second P-region layer is formed of organic semiconductor material or inorganic compound;

the first P-region layer is formed of organic semiconductor material or inorganic compound, and the second P-region layer is formed of quantum dot semiconductor material; or both the first P-region layer and the second P-region layer are formed of quantum dot semiconductor material.

16. The depth imaging system according to claim 12, wherein the light absorption layer comprises:

an I-region layer formed above the N-region layer, wherein the P-region layer is formed above the I-region layer.

17. The depth imaging system according to claim 12, wherein the light absorption layer comprises:

a first P-region layer formed above the N-region layer;

an I-region layer formed above the first P-region layer; and a second P-region layer formed above the I-region layer, wherein the second P-region has a doping concentration that is higher than that of the first P-region layer.

18. The depth imaging system according to claim 17, wherein:

the first P-region layer is formed of quantum dot semiconductor material, and the second P-region layer is formed of organic semiconductor material or inorganic compound;

the first P-region layer is formed of organic semiconductor material or inorganic compound, and the second P-region layer is formed of quantum dot semiconductor material; or both the first P-region layer and the second P-region layer are formed of quantum dot semiconductor material.

19. The depth imaging system according to claim 12, wherein the image sensor further comprises:

a filter layer formed above the positive electrode layer, wherein the filter layer is configured to filter out light signals with preset range of wavelengths; and a micro-lens layer formed above the filter layer, wherein the micro-lens layer contains micro-lenses each of which corresponds to one of the multiple cylindrical structures in the N-region layer.

20. The depth imaging system according to claim 12, wherein the N-region layer is composed of quantum dot semiconductor materials, semiconductor nanoparticles, inorganic, or organic semiconductor bulk materials.

\* \* \* \* \*